United States Patent
Chang

(10) Patent No.: US 8,779,303 B2
(45) Date of Patent: Jul. 15, 2014

(54) HYBRID PACKAGE

(75) Inventor: Li-Tien Chang, Taipei (TW)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/984,544

(22) Filed: Jan. 4, 2011

(65) Prior Publication Data

US 2011/0095426 A1 Apr. 28, 2011

Related U.S. Application Data

(63) Continuation of application No. 12/034,490, filed on Feb. 20, 2008, now Pat. No. 7,894,199.

(51) Int. Cl.
*H01L 23/49* (2006.01)
*H05K 1/11* (2006.01)

(52) U.S. Cl.
USPC ........... 174/538; 174/262; 174/527; 174/536; 438/106

(58) Field of Classification Search
CPC ........... H01L 2224/48247; H01L 2224/49171; H01L 2924/14; H01L 23/057; H01L 23/047
USPC ......... 174/260–262, 520, 521, 527–530, 532, 174/534, 536, 538; 361/767, 760, 768, 777, 361/808, 736, 737, 748, 784, 803; 438/106, 438/123, 124; 257/734, 676, 678, E23.031
See application file for complete search history.

(56) References Cited

U.S. PATENT DOCUMENTS

| 5,534,467 | A | * | 7/1996 | Rostoker .......................... 29/827 |
| 6,103,548 | A | | 8/2000 | Miks et al. |
| 6,228,682 | B1 | | 5/2001 | Farooq et al. |
| 6,969,632 | B2 | | 11/2005 | Moden |
| 7,714,451 | B2 | | 5/2010 | Lee et al. |
| 7,728,422 | B2 | | 6/2010 | Kim et al. |
| 7,919,868 | B2 | | 4/2011 | Hedler et al. |
| 2004/0095736 | A1 | | 5/2004 | Choi et al. |
| 2005/0186705 | A1 | * | 8/2005 | Jackson et al. ................ 438/106 |
| 2007/0020926 | A1 | * | 1/2007 | Kalvesten et al. ............ 438/667 |
| 2008/0198561 | A1 | | 8/2008 | Oiwa |
| 2009/0072381 | A1 | * | 3/2009 | Ishihara et al. ............... 257/700 |
| 2009/0085201 | A1 | * | 4/2009 | Mathew ........................ 257/734 |

* cited by examiner

*Primary Examiner* — Hoa C Nguyen
(74) *Attorney, Agent, or Firm* — Womble, Carlyle, Sandridge & Rice

(57) ABSTRACT

The embodiments described herein provide for a packaging configuration that provides leads or connections for a packaging substrate from opposing surfaces of a package. Through silicon vias (TSV) are provided in order to accommodate additional input/output (I/O) pins that smaller dies are supporting. Various combinations of packages are enabled through the embodiments provided.

18 Claims, 5 Drawing Sheets

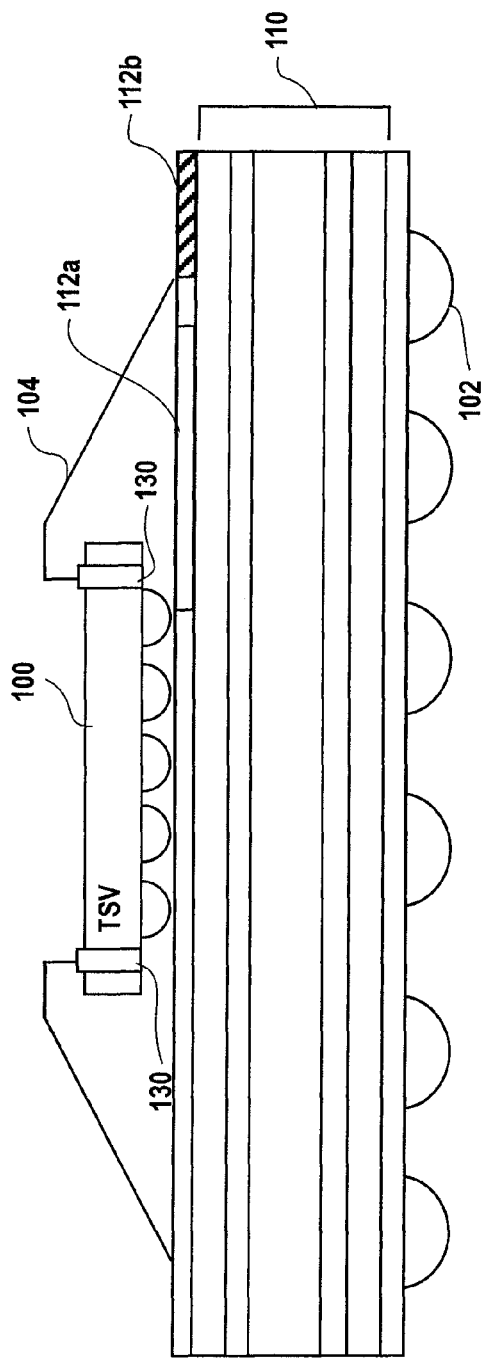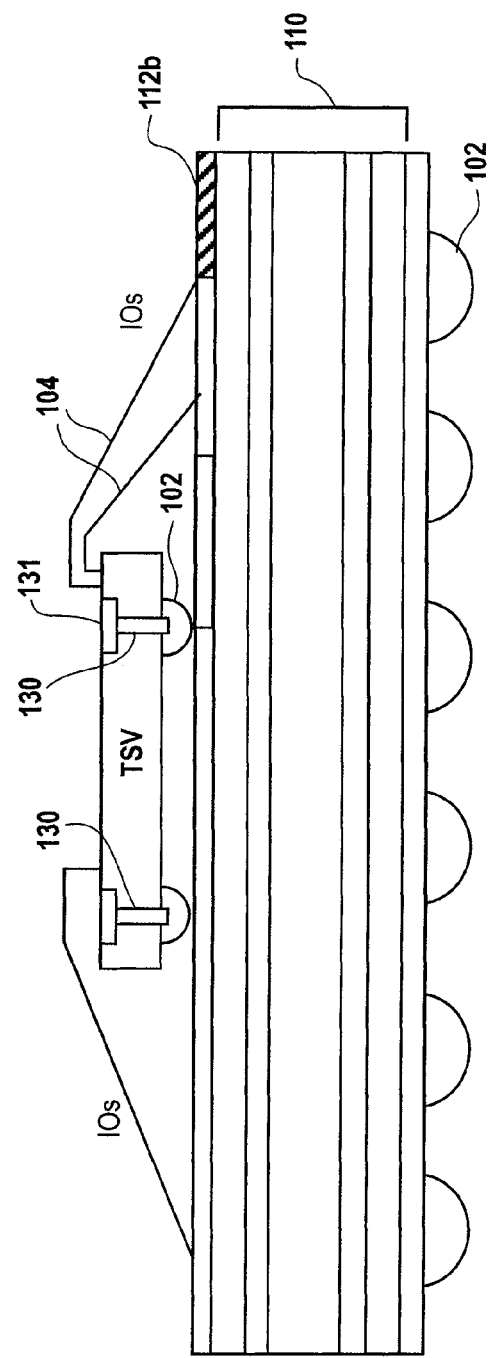
FIG. 6A
FIG. 6B

HYBRID PACKAGE

CLAIM OF PRIORITY

This application is a continuation application of and claims priority from U.S. patent application Ser. No. 12/034,490 filed on Feb. 20, 2008 now U.S. Pat. No. 7,894,199. The disclosure of this related application is incorporated herein by reference for all purposes.

BACKGROUND

Packaging configurations for semiconductor circuits typically include mounting of the die having the integrated circuit to a substrate, which in turn is mounted onto a printed circuit board or another substrate. As die sizes shrink and input/output pin counts increase or remain the same, the pitch of the ball grid array commonly used for packaging is becoming a bottleneck in limiting the amount of connections. Due to limits in the size of the solder bumps used for the ball grid array, the amount of I/O connections provided by the ball grid array is reaching a maximum.

In addition, when a chip manufacturer provides numerous families, e.g., STRATIX™ and HARDCOPY™ families of the assignee, it is desirable for a customer to be able to use the same printed circuit board for an alternative chip from the manufacturer. Typically, the die sizes of the chips from the different families is different but the pin count is the same, with the later introduced chip having a smaller die size. In order to accommodate the chip having a smaller die size, adjustments have to be made for routing the I/O connections. The congestion experienced by the smaller die size can cause signal integrity issues.

Thus, there is a need for an improved packaging configuration to relieve the bump pitch and congestion as die sizes continue to shrink and pin counts increase.

SUMMARY OF THE INVENTION

Broadly speaking, the present invention fills these needs by providing a hybrid package utilizing through silicon vias to enable placement of contacts on opposing sides of an integrated circuit die. It should be appreciated that the present invention can be implemented in numerous ways, including as a method, a system, or an apparatus. Several inventive embodiments of the present invention are described below.

In one aspect of the invention, a hybrid package is provided where opposing sides on the integrated circuit die have contacts to provide relief from a dense ball and grid array. By utilizing a through silicon via extending between opposing sides on the die, electrical contacts can be provided on the opposing sides of the die. Therefore, the die can be mated with contacts on a surface of a packaging substrate with leads or connection from both sides of the die rather than a single side of the die. In one embodiment, the packaging configuration used for the opposing sides is different, e.g., a ball and grid array on one side and a wire bond on the opposing side. The die may be embedded within the packaging substrate and solder bumps from a ball and grid array may be disposed on both opposing sides to connect with the solder bumps of the packaging substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention can be best understood by reference to the following description taken in conjunction with the accompanying figures, in which like parts may be referred to by like numerals.

FIGS. 6A and 6B illustrate a simplified schematic diagram of alternative embodiments for the hybrid packaging configuration in accordance with one embodiment of the invention.

DETAILED DESCRIPTION OF THE INVENTION

The embodiments described herein describe a hybrid packaging configuration that enables a relatively small package to more efficiently route out connections in a manner that relieves routing congestion. It will be obvious, however, to one skilled in the art, that the present invention may be practiced without some or all of these specific details. In other instances, well known process operations have not been described in detail in order not to unnecessarily obscure the present invention.

The embodiments described herein provide for a packaging configuration that provides leads from opposing surfaces of a package. Through silicon vias (TSV) are provided in order to accommodate additional input/output (I/O) pins that smaller dies are supporting. In one embodiment, the packaging configuration is a hybrid configuration that provides wire bond pads around a perimeter of the package and a ball grid array on an opposing side of the package from the wire bond leads. In this embodiment, the wire bond pads may be used for propagating signals not requiring high speeds and do not require superior signal integrity performance, while the ball grid array is dedicated to the high speed signals with low inductance. The embodiments provide relief for the bump pitch shrinkage being forced through the shrinking die sizes and increasing I/O counts, by removing some of the I/Os from the ball grid array to a wire bond connection on an opposing side of the die. That is, the embodiments described herein provide a hybrid package where a flip chip and wire bond packaging configuration are utilized in the same package in order to shrink the relief bump pitch of the flip chip configuration. In one embodiment, some of the input/output signals of the flip chip design are switched to a wire bond connection by a through silicon via (TSV) to redistribute the flip chip bump pads to wire bond pads. A die package having a plurality of bump pads, e.g., a flip chip ball grid array, located on a first surface and a plurality of wire bond connections located on a second surface opposing the first surface is provided. The bump pads will connect with a package substrate, as well as the wires from the wire bond pads. The combination of the wire bond pads combined and with the ball grid array is enabled by the TSV technology. The more critical high speed signals that require low inductance or power ground signals may be provided through the flip chip configuration. Alternate hybrid packaging configurations are described below in more detail.

Figure 1:
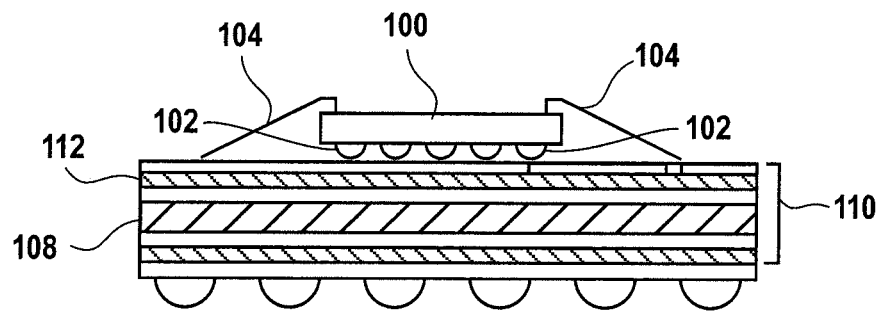
FIG. 1 is a simplified schematic diagram illustrating a hybrid packaging configuration in accordance with one embodiment of the invention.

FIG. 1 is a simplified schematic diagram illustrating a hybrid packaging configuration in accordance with one embodiment of the invention. Flip chip package includes die 100 having a plurality of solder bumps 102 disposed along a first surface of the die. In addition, flip chip 100 includes wire bond extensions 104 that provide an electrical connection with package substrate 110. Flip chip bumps 102 are in electrical communication with a top surface 112 of package substrate 110. Through routing supplied within package substrate 110 the electrical signals traverse an electrical pathway defined between a printed circuit board disposed below package substrate 110 and the integrated circuit within the flip chip package. Package substrate 110 is composed of a core region 108 and subsequent power and ground planes distributed within package substrate 110. As will be explained in more detail below a through silicon via extending between opposing surfaces of die 100 enable the use of wire bonds 104 and solder bumps 102 in one embodiment of the hybrid package. The through silicon via may be defined within die 100 through known semiconductor manufacturing operations, such as a deep reaction ion etch process followed by a plating technique to fill the opening formed by the etch process. One skilled in the art will appreciate that solder bumps 102 may be C4 solder bumps commonly used in flip chip packaging configurations. In addition, the materials for the flip chip packaging components, including the packaging substrate are materials commonly employed and commercially available for flip chip packages.

Figure 2:
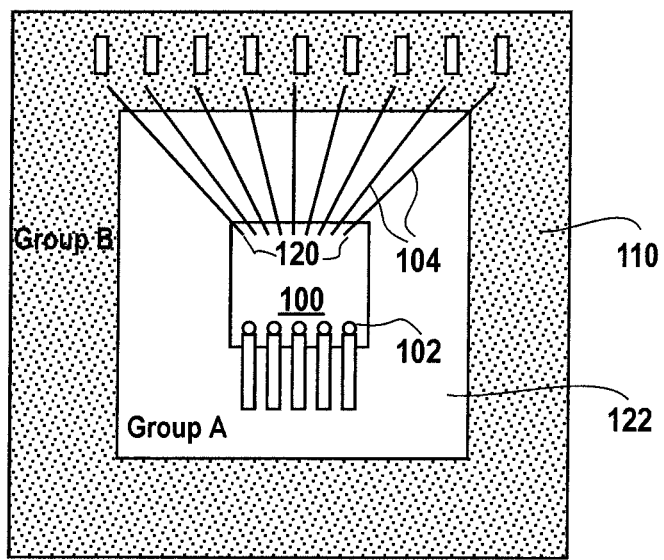
FIG. 2 is a top view illustration of the hybrid package of FIG. 1 in accordance with one embodiment of the invention.

FIG. 2 is a top view illustration of the hybrid package of FIG. 1 in accordance with one embodiment of the invention. As illustrated, die 100 has relief bumps 102 on one surface against package substrate 110, as well as wire bond connections 104 connecting to an opposing surface of die 100. Wire bond connection 104 are in electrical communication with pads 120 in order to provide a signal pathway to and from die 100 to packaging substrate 110. Similarly, solder bumps 102 are in communication with connections or relief bumps for packaging substrate 110 in order to provide an electrical pathway for connections to a printed circuit board disposed below the packaging substrate. As illustrated, wire bond connections 104 are distributed along an outer ring of substrate 110 while the critical or high speed connections are within region 122 of packaging substrate 110. In one embodiment, the through silicon via connects a contact pad on a bottom surface of die 100 and extends to a contact pad on the top surface in order to provide a contact pad for wire bond 104. Thus, the pitch of the solder bumps for the ball and grid array is relieved by movement of contacts to an opposing surface of the die.

Figure 3:
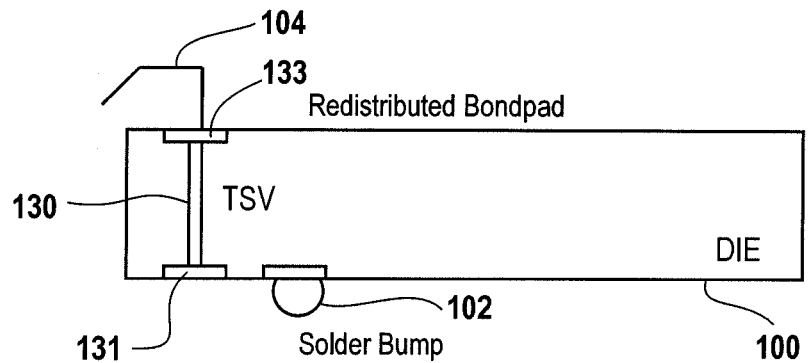
FIG. 3 is a simplified schematic diagram illustrating a through-silicon via structure enabling redistribution of bond pads in accordance with one embodiment of the invention.

FIG. 3 is a simplified schematic diagram illustrating a through-silicon via structure enabling redistribution of bond pads in accordance with one embodiment of the invention. Die 100, which is packaged in a flip chip configuration includes solder bump 102 and through-silicon via 130. Through-silicon via 130 is defined through an entirety of die 100 and connects contact pad 131 with contact pad 133. As a result, a bond pad that was previously a solder bump on a bottom surface of die 100 may be redistributed to a top surface of die 100 as a wire bond connection, a solder bump connection or any other suitable packaging connection.

Figure 4:
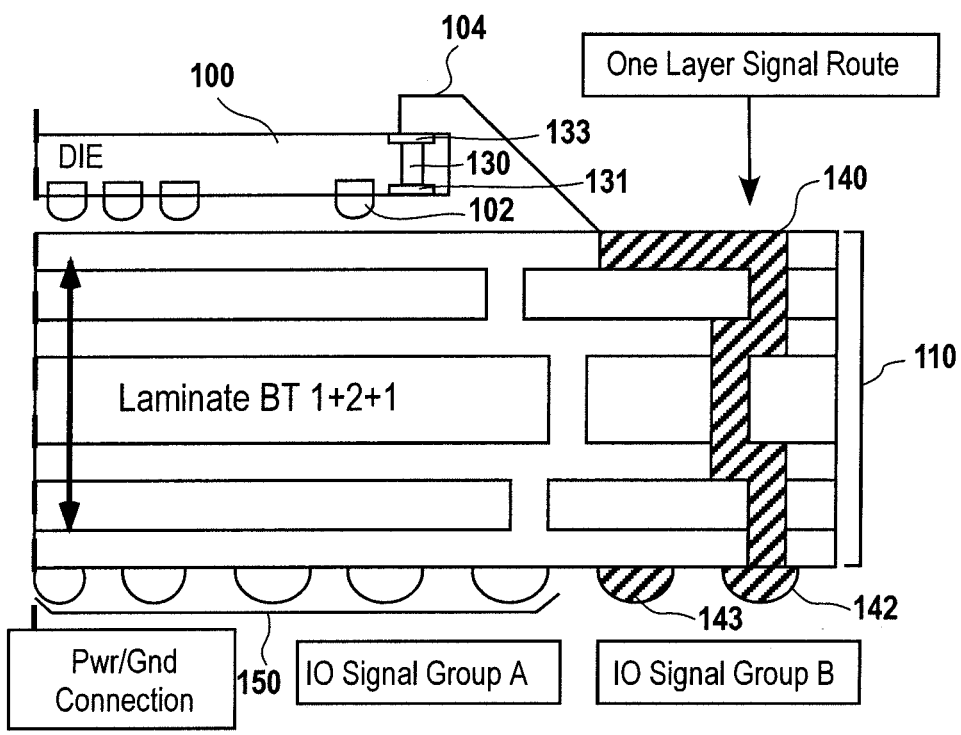
FIG. 4 is a simplified schematic diagram illustrating a hybrid packaging configuration in accordance with one embodiment of the invention.

FIG. 4 is a simplified schematic diagram illustrating a hybrid packaging configuration in accordance with one embodiment of the invention. Flip chip 100 includes an outer region of wire bond connections in electrical communication with core 110. In one embodiment, the outer region of die 100 includes one or more rows of wire bond contacts surrounding or encompassing the corresponding ball and grid array region on the opposing surface of die 100. It should be appreciated that the embodiments are not limited to this configuration as any number of locations may be transferred from the bottom contacts to opposing upper contacts through the through silicon vias in order to relieve the pitch for the ball and grid array on the bottom surface. Within core 110, various electrical pathways for routing the signal to corresponding solder bumps on a lower surface of the core is provided. One exemplary signal route is route 140 in which a wire bond connection from a top surface of die 100 provides an electrical pathway to solder bump 142. Inner solder bumps 102 of die 100 are connected to a top surface of core 110 in order to distribute the corresponding signals to lower solder bumps 150. It should be appreciated that certain signals may be grouped together in order to provide relief of the solder bump pitch on the lower surface of die 100. For example, the signals related to lower speed non-critical pathways will be distributed through solder bump 142 and 143 via corresponding wire bonds emanating from a first side of die 100. More critical signals such as high speed communication signals and power and ground connections will be distributed to solder bumps 150. It should be further appreciated that various configurations may be employed and the embodiments are not limited to the illustrated figures. For example, a flip chip die with wire bond pads may be provided through the through silicon via (TSV) connections 130 in one embodiment (See FIG. 6A). In another embodiment, a wire bond die with flip chip bumps provided through the TSV connections 130 is also enabled (See FIG. 6B). In this embodiment, the flip chip bumps on the wire bond die may be used for high speed critical signals that require low inductance or power ground signals that require direct connection to a plane. In another embodiment, a lead frame package may have corresponding upper and lower bond pads in order to relieve the density of connections on one surface of the lead frame package (See FIG. 7). Thus, the real estate available for providing connections is doubled through the embodiments described herein and the TSV technology.

Figure 5:
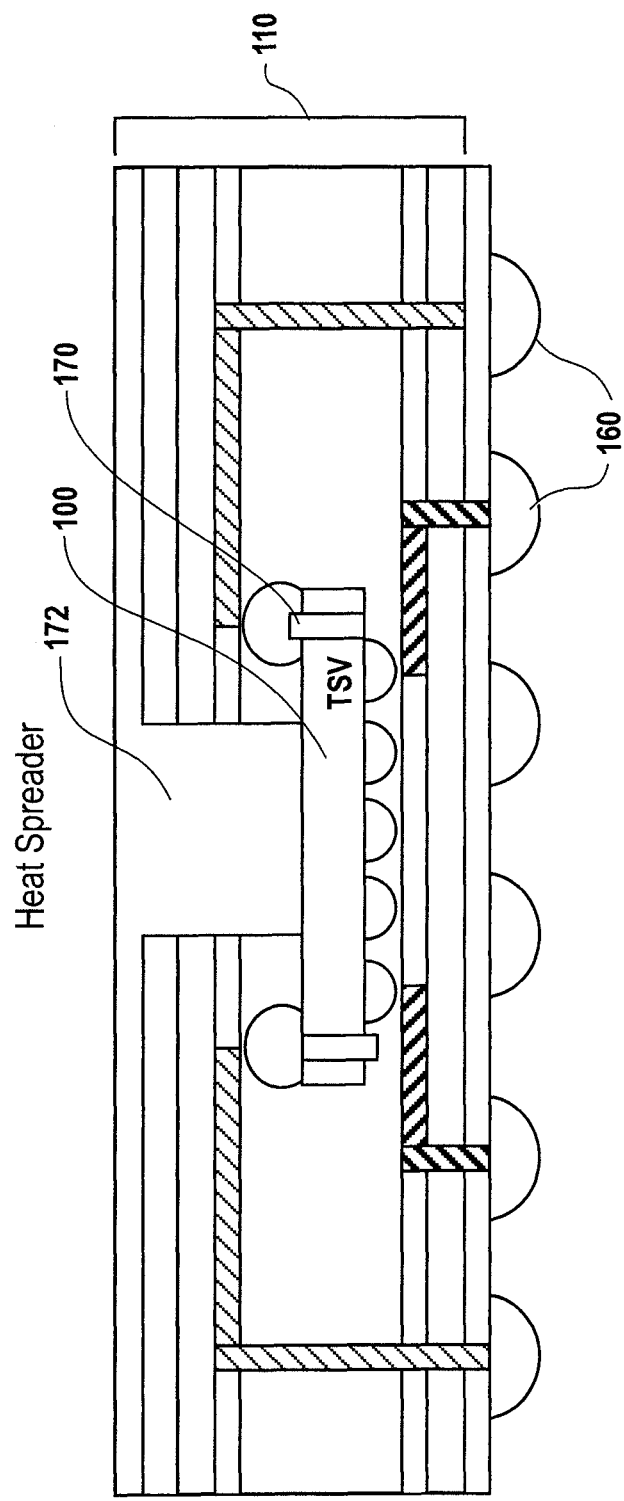
FIG. 5 is a simplified schematic diagram illustrating an embedded flip chip package having through silicon via (TSV) routing in accordance with one embodiment of the invention.

FIG. 5 is a simplified schematic diagram illustrating an embedded flip chip package having TSV routing in accordance with one embodiment of the invention. Core region or package substrate 110 has flip chip package 100 embedded therein. Through a routing and distribution network within core region 110 various signals from flip chip package 100 are delivered to a circuit board through solder bumps 160. TSV 170 provides solder bumps to be on opposing surfaces rather than a single-sided surface. In a mid-region of flip chip 100 is a heat sink 172 which spreads heat generated by the package 100. One skilled in the art will appreciate that package substrate 110 is composed of a rigid material, e.g., ceramics, that will prevent flip chip package 100 from experiencing certain stresses such as bending, etc. Thus, in addition to being insulative material, the package material for core 110 will be composed so as not to easily bend so as to resist any bending to avoid placing stresses on die 100 of the flip chip packaging configuration.

FIGS. 6A and 6B illustrate a simplified schematic diagram of alternative embodiments for the hybrid packaging configuration in accordance with one embodiment of the invention. In FIG. 6A, TSV 130 enable the use of wire bonds 104 from an opposing side of die 100 relative to solder bumps 102 of the flip chip package. Here solder bumps 102 are electrically connected to a top surface, e.g., region 112a, of package substrate 110, while wire bonds 104 are connected to an outer region of the top surface, e.g., region 112b, of the package substrate. In one embodiment, the contact points for the wire bonds, such as region 112b, surround the contact points for the solder balls, such as region 112a, on the packaging substrate. It should be appreciated that numerous contact points may be defined on the surface of the packaging substrate and that a single contact point for each packaging configuration type is provided for ease of illustration. FIG. 6B illustrates a wire bond package having TSV 130 enabling a solder ball 102 to be defined on an opposing side of die 100 from wire bonds 104 and corresponding wire bond contacts.

Figure 7:
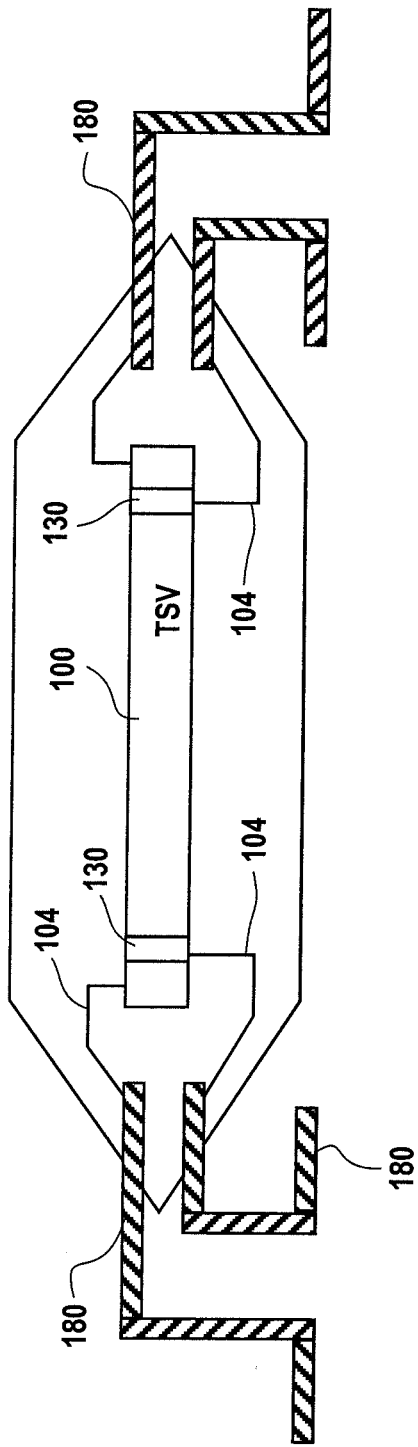
FIG. 7 is a simplified schematic diagram of a lead frame configuration having TSV to enable opposing sides of the die to connect to corresponding lead frames in accordance with one embodiment of the invention.

FIG. 7 is a simplified schematic diagram of a lead frame configuration having TSV to enable opposing sides of the die to connect to corresponding lead frames in accordance with one embodiment of the invention. TSV 130 provides connections for an opposing side of die 100 so that wires 104 may be disposed on both sides to connect with leads 180.

In summary, the above-described invention provides a design for packaging an integrated circuit to provide for effective escape routing and accommodate a large number of I/O counts on shrinking die sizes. It should be appreciated that the embodiments may be applied to any integrated circuit package including packages for processors, ASICs, and PLDs. In one embodiment, the programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A semiconductor package, comprising:
    an integrated circuit (IC) die having a plurality of contact pads each located on a surface of the IC die;
    a first plurality of external leads coupled to a first portion of the plurality of contact pads, located on a first surface of the IC die, by a first wirebond assembly that attaches, at the first surface of the IC die, to the first portion of the plurality of contact pads, wherein a portion of the first plurality of external leads, the first wirebond assembly attaching to the portion of the first plurality of external leads, is coplanar with the first surface of the IC die; and
    a second plurality of external leads coupled to a second portion of the plurality of contact pads, located on a second surface of the IC die, by a second wirebond assembly coupled to a through silicon via (TSV) assembly, the second wirebond assembly attaching, at the second surface of the IC die, to the through silicon via assembly, wherein the first surface and the second surface are opposing surfaces of the IC die.

2. The semiconductor package of claim 1, wherein the first and second wirebond assemblies each comprise:
    a wire extending from one of the plurality of contact pads to one of the respective first or second plurality of external leads.

3. The semiconductor package of claim 1, wherein the TSV assembly comprises:
    a TSV extending from one of the plurality of contact pads to a corresponding contact pad of an opposing surface of the IC die.

4. The semiconductor package of claim 1, wherein the first wirebond assembly directly couples the IC die to the first plurality of external leads.

5. The semiconductor package of claim 1, wherein the TSV assembly couples the IC die to the second plurality of external leads via the second wirebond assembly.

6. The semiconductor package of claim 1, wherein the first surface and the second surface of the IC die are encapsulated.

7. The semiconductor package of claim 1, wherein the first portion of the plurality of contact pads do not vertically overlap the second portion of the plurality of contact pads of the IC die.

8. The semiconductor package of claim 1, wherein the IC die is supported by the first and second wirebond assemblies.

9. The semiconductor package of claim 8, wherein the IC die is supported without a support substrate or without a die pad.

10. The semiconductor package of claim 1, wherein the IC die comprises a wirebond package with TSVs connected to the second plurality of external leads.

11. An embedded semiconductor package, comprising:
    an integrated circuit (IC) die having a first plurality of contact pads located on a first surface of the IC die and a second plurality of contact pads located on a second surface of the IC die; and
    a package substrate surrounding multiple sides of the IC die, wherein the first plurality of contact pads is coupled to the package substrate at an inner area of the first surface of the IC die by a first solder bump assembly, and the second plurality of contact pads is coupled to the package substrate at a peripheral area of the second surface of the IC die by a through silicon via (TSV) assembly, the TSV assembly comprising a TSV extending from each contact pad of the first plurality of contact pads to corresponding contact pads of the second surface of the IC die, wherein the corresponding contact pads of the second surface are in electrical communication with the package substrate through a second solder bump assembly.

12. The embedded semiconductor package of claim 11, wherein the TSV assembly directly couples the IC die to the package substrate.

13. The embedded semiconductor package of claim 11, wherein the first surface of the IC die and the second surface of the IC die face a surface of the package substrate.

14. The embedded semiconductor package of claim 11, wherein the second plurality of contact pads at the peripheral area of the second surface of the IC die do not vertically overlap the first plurality of contact pads at the inner area of the first surface of the IC die.

15. The embedded semiconductor package of claim 11, wherein the IC die comprises a flip chip with TSVs connected to the second solder bump assembly.

16. The embedded semiconductor package of claim 11, further comprising: a heat sink attached to the IC die.

17. A method of providing multiple speed signals in a semiconductor package, the method comprising:
   providing lower speed signals from a first plurality of contact pads coupled to a first surface of an integrated circuit (IC) die of the semiconductor package, wherein the lower speed signals are distributed via the first plurality of contact pads coupled to a wirebond assembly, wherein the wirebond assembly directly couples the IC die to a package substrate of the semiconductor package; and
   providing higher speed signals from a second plurality of contact pads coupled to a through silicon via (TSV) assembly at a second surface of the IC die.

18. The method of claim 17, wherein the higher speed signals are distributed via the second plurality of contact pads coupled to one or more solder bumps.

* * * * *